(12) United States Patent
Ikeda et al.

(10) Patent No.: US 9,543,123 B2
(45) Date of Patent: Jan. 10, 2017

(54) PLASMA PROCESSING APPARATUS AND PLASMA GENERATION ANTENNA

(75) Inventors: Taro Ikeda, Nirasaki (JP); Tomohito Komatsu, Nirasaki (JP); Shigeru Kasai, Nirasaki (JP)

(73) Assignee: TOKYO ELECTRONICS LIMITED, Tokyo (JP)

(*) Notice: Subject to any disclaimer, the term of this patent is extended or adjusted under 35 U.S.C. 154(b) by 843 days.

(21) Appl. No.: 13/435,552

(22) Filed: Mar. 30, 2012

(65) Prior Publication Data

US 2012/0247675 A1 Oct. 4, 2012

Related U.S. Application Data

(60) Provisional application No. 61/537,742, filed on Sep. 22, 2011.

(30) Foreign Application Priority Data

Mar. 31, 2011 (JP) ................. 2011-078029
Mar. 28, 2012 (JP) ................. 2012-072759

(51) Int. Cl.
*C23C 16/00* (2006.01)
*C23F 1/00* (2006.01)
(Continued)

(52) U.S. Cl.
CPC ..... *H01J 37/3222* (2013.01); *C23C 16/45565* (2013.01); *C23C 16/511* (2013.01);
(Continued)

(58) Field of Classification Search
USPC .. 156/345.34, 345.41, 345.33; 118/723 MW, 118/715
See application file for complete search history.

(56) References Cited

U.S. PATENT DOCUMENTS 4,333,814 A * 6/1982 Kuyel ................. 204/298.34
4,776,918 A * 10/1988 Otsubo ................ C23C 16/517
118/50.1
(Continued)

FOREIGN PATENT DOCUMENTS

CN 101047118 A 10/2007
CN 101371341 A 2/2009
(Continued)

OTHER PUBLICATIONS

English Machine Translation JP2002371367, Hatta et al dated Dec. 26, 2002.*

*Primary Examiner* — Rakesh Dhingra
(74) *Attorney, Agent, or Firm* — Brundidge & Stanger, P.C.

(57) ABSTRACT

A plasma generation antenna and a plasma processing apparatus can supply a gas and an electromagnetic wave effectively. A plasma processing apparatus 10 includes a processing chamber 100 in which a plasma process is performed; a wavelength shortening plate 480 configured to transmit an electromagnetic wave; and a plasma generation antenna 200 having a shower head 210 provided adjacent to the wavelength shortening plate 480. The shower head 210 is made of a conductor, and has a multiple number of gas holes 215 and a multiple number of slots 220 through which the electromagnetic wave passes. The slots 220 are provided at positions isolated from the gas holes 215.

7 Claims, 12 Drawing Sheets

(51) Int. Cl.
  *H01L 21/306* (2006.01)
  *H01J 37/32* (2006.01)
  *C23C 16/455* (2006.01)
  *H05H 1/46* (2006.01)
  *C23C 16/511* (2006.01)

(52) U.S. Cl.
  CPC ..... *H01J 37/3244* (2013.01); *H01J 37/32211* (2013.01); *H01J 37/32229* (2013.01); *H01J 37/32449* (2013.01); *H05H 1/46* (2013.01); *H05H 2001/463* (2013.01)

(56) References Cited

U.S. PATENT DOCUMENTS

| | | | |
|---|---|---|---|
| 5,545,258 A * | 8/1996 | Katayama et al. | 118/723 MW |
| 5,698,036 A * | 12/1997 | Ishii et al. | 118/723 MW |
| 6,245,192 B1 * | 6/2001 | Dhindsa et al. | 156/345.34 |
| 6,286,454 B1 | 9/2001 | Hirayama et al. | |
| 7,083,701 B2 * | 8/2006 | Ohmi | H01J 37/32211 118/723 MW |
| 8,197,913 B2 * | 6/2012 | Matsuoka | C23C 16/0272 427/569 |
| 2005/0178748 A1 | 8/2005 | Buchberger, Jr. et al. | |
| 2005/0276928 A1 | 12/2005 | Okumura et al. | |
| 2007/0221623 A1 * | 9/2007 | Horiguchi et al. | 216/69 |
| 2007/0235425 A1 * | 10/2007 | Oka et al. | 219/121.43 |
| 2009/0045749 A1 | 2/2009 | Ganachev et al. | |
| 2009/0074632 A1 | 3/2009 | Ishibashi et al. | |
| 2009/0159214 A1 | 6/2009 | Kasai | |
| 2009/0242133 A1 | 10/2009 | Nakayama et al. | |
| 2011/0061814 A1 | 3/2011 | Ikeda | |
| 2011/0174778 A1 * | 7/2011 | Sawada et al. | 216/68 |
| 2011/0271908 A1 | 11/2011 | Chang et al. | |
| 2012/0247675 A1 | 10/2012 | Ikeda et al. | |
| 2013/0292047 A1 | 11/2013 | Tian et al. | |

FOREIGN PATENT DOCUMENTS

| | | | |
|---|---|---|---|
| CN | 101971302 A | 2/2011 | |
| EP | 0264913 A2 | 4/1988 | |
| JP | S63263725 A | 10/1988 | |
| JP | H07335633 A | 12/1995 | |
| JP | 2000294550 A | 10/2000 | |
| JP | 2002299330 A | 10/2002 | |
| JP | 2002-371367 | * 12/2002 | C23C 16/511 |
| JP | 2003-188103 | 7/2003 | |
| JP | 2003-234327 | 8/2003 | |
| JP | 2005196994 A | 7/2005 | |
| JP | 2007221116 A | 8/2007 | |
| JP | 201087227 A | 4/2010 | |
| JP | 2012216745 A | 11/2012 | |
| TW | 200628021 A | 8/2006 | |
| TW | 200948217 A | 11/2009 | |
| TW | 201001530 A1 | 1/2010 | |
| WO | 2008013112 A1 | 1/2008 | |
| WO | 2010004997 A1 | 1/2010 | |
| WO | 2010140528 A1 | 12/2010 | |

* cited by examiner

PLASMA PROCESSING APPARATUS AND PLASMA GENERATION ANTENNA

CROSS-REFERENCE TO RELATED APPLICATION

This application claims the benefit of Japanese Patent Application Nos. 2011-078029 and 2012-072759 filed on Mar. 31, 2011 and Mar. 28, 2012, respectively, and U.S. Provisional Application No. 61/537,742 filed on Sep. 22, 2011, the entire disclosures of which are incorporated herein by reference.

FIELD OF THE INVENTION

The present disclosure relates to a plasma processing apparatus and a plasma generation antenna. More particularly, the present disclosure relates to a structure of a plasma generation antenna and a plasma processing apparatus using the antenna.

BACKGROUND OF THE INVENTION

A plasma process is an essential technique for manufacturing a semiconductor device. To meet a recent requirement for high integration and high speed of LSI, semiconductor devices forming the LSI are required to be further miniaturized.

In a capacitively coupled plasma processing apparatus and an inductively coupled plasma processing apparatus, however, electron temperature of generated plasma is high and a region having high plasma density is limited. For these reasons, it has been difficult to perform a plasma process capable of satisfying the requirement for further miniaturization of the semiconductor devices.

In this regard, in order to achieve high level of miniaturization, it is necessary to generate plasma having low electron density and high plasma density. To meet such a requirement, there has been proposed a plasma processing apparatus configured to generate surface wave plasma in a processing chamber by microwave and to perform a plasma process on a semiconductor wafer (see, for example, Patent Documents 1 and 2).

In Patent Documents 1 and 2, there is described a plasma processing apparatus configured to radiate a microwave into a processing chamber through a coaxial tube and generate surface wave plasma having low electron temperature and high plasma density by exciting a gas by electric field energy of the surface wave of the microwave.

Patent Document 1: Japanese Patent Laid-open Publication No. 2003-188103

Patent Document 2: Japanese Patent Laid-open Publication No. 2003-234327

In the plasma processing apparatus of Patent 1, however, in order to radiate the microwave into the processing chamber through the coaxial tube, a ceiling plate of the processing chamber has a structure in which a dielectric plate such as quartz is provided between the surface wave plasma and slots, and the gas is supplied into the processing chamber from a sidewall of the processing chamber. Since the gas is supplied from an outside of the ceiling plate, a gas flow may not be controlled, which makes it difficult to control the plasma effectively. Further, although it is described that the ceiling plate may be made of a conductor, a structure capable of radiating an electromagnetic wave into the processing chamber is not mentioned.

BRIEF SUMMARY OF THE INVENTION

In view of the foregoing, illustrative embodiments provide a plasma generation antenna and a plasma processing apparatus capable of supplying a gas and an electromagnetic wave effectively.

In accordance with one aspect of an illustrative embodiment, there is provided a plasma processing apparatus includes a processing chamber in which a plasma process is performed; a wavelength shortening plate configured to transmit an electromagnetic wave; and at least one plasma generation antenna having a shower head provided adjacent to the wavelength shortening plate. The shower head may be made of a conductor, and may have a multiple number of gas holes and a multiple number of slots through which the electromagnetic wave passes. The multiple number of slots may be provided at positions isolated from the multiple number of gas holes.

The at least one plasma generation antenna may be plural in number.

A surface wave may be propagated on a surface of the shower head exposed to a plasma space.

The multiple number of gas holes may be provided at inner and outer positions of the plurality of slots in the shower head.

The plasma processing apparatus may further include a gas path extending through a partitioned portion between the multiple number of slots. The gas path may be configured to supply a gas into the gas holes provided at the inner positions of the multiple number of slots.

The gas path may be divided into a multiple number of gas paths through which a multiple number of gases are supplied individually.

The multiple number of gas paths may be concentrically arranged with respect to a central axis of the shower head.

Each of the plasma generation antennas may include an electromagnetic wave transmission device configured to adjust an electric power of the surface wave.

The plasma processing apparatus may further include a DC voltage application device configured to apply a DC voltage to the shower head.

The DC voltage application device may have an insulating member provided between the DC voltage application device and a coaxial tube that is provided on the wavelength shortening plate and configured to transmit the electromagnetic wave to the wavelength shortening plate.

The multiple number of slots may be filled with a dielectric member.

The multiple number of slots may be symmetrically arranged with respect to a central axis of the at least one plasma generation antenna.

A surface of the shower head may be thermally sprayed or a ceiling plate may be fixed on a surface of the shower head. Openings that communicate with the multiple number of slots and the multiple number of gas holes may be formed in the shower head.

The shower head may be made of silicon, and a surface of the shower head may be exposed.

In accordance with another aspect of an illustrative embodiment, there is provided a plasma generation antenna includes a shower head, made of a conductor, having a multiple number of gas holes and a multiple number of slots through which an electromagnetic wave passes. The multiple number of slots may be provided at positions isolated from the multiple number of gas holes.

As described above, in accordance with an illustrative embodiment, it is possible to provide a plasma generation antenna and a plasma processing apparatus capable of supplying a gas and an electromagnetic wave effectively.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
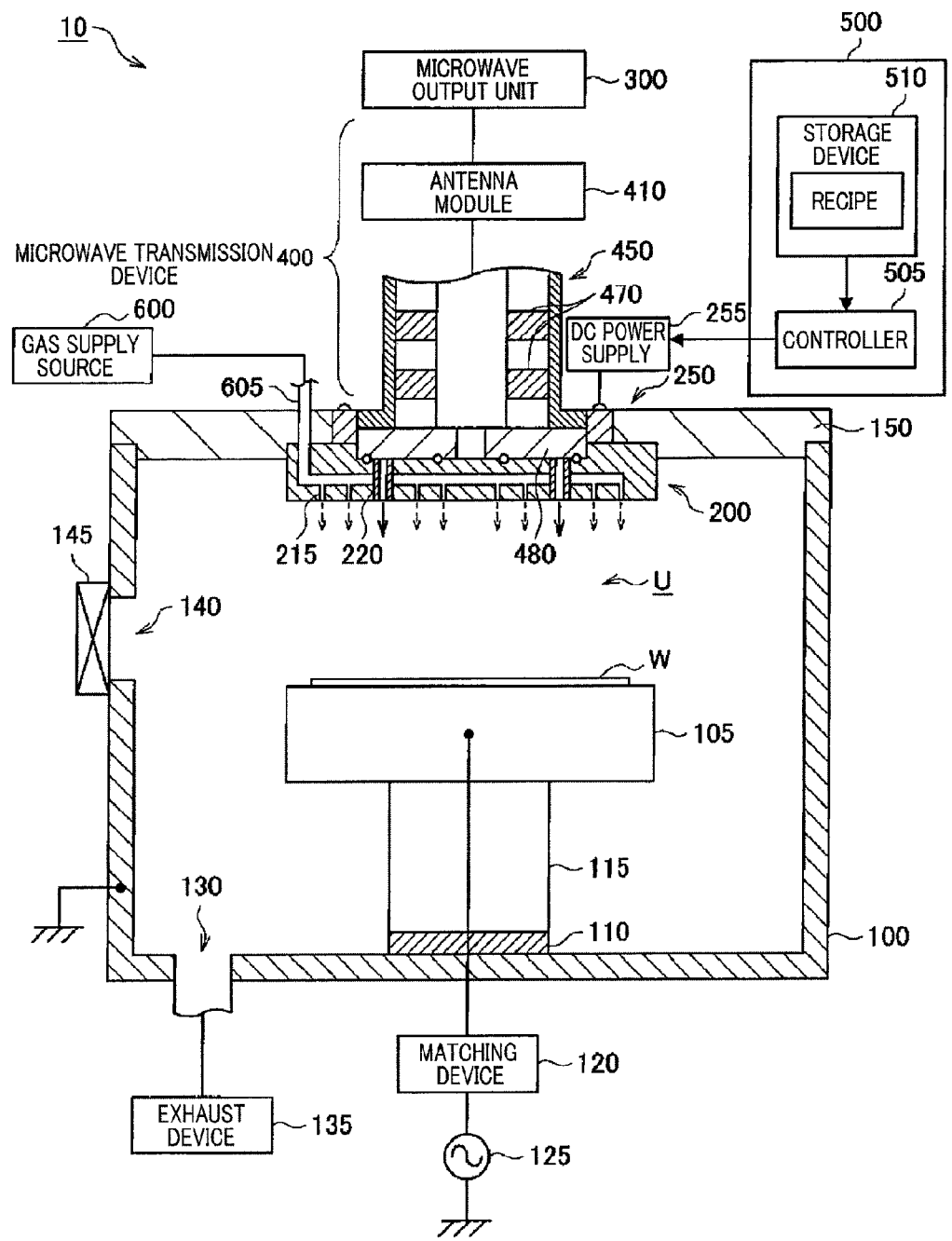
FIG. 1 is a schematic cross sectional view of a plasma processing apparatus in accordance with a first illustrative embodiment.

Hereinafter, illustrative embodiments will be described in detail with reference to the accompanying drawings. Through the specification and drawings, parts having substantially same functions will be assigned same reference numerals, and redundant description will be omitted.

Below, a first to a fourth illustrative embodiment will be described in sequence. The first to the fourth illustrative embodiment are directed to the following.

<First illustrative embodiment>
[Configuration of plasma processing apparatus]
[Configuration of plasma generation antenna]
[Modification example of slot]
<Second illustrative embodiment>
[Configuration of plasma generation antenna]
<Third illustrative embodiment>
[Configuration of plasma generation antenna]

<Fourth illustrative embodiment>
[Configuration of plasma generation antenna]
[Operation of plasma generation antenna]

First Illustrative Embodiment

Configuration of Plasma Processing Apparatus

First, an overall configuration of a plasma processing apparatus in accordance with a first illustrative embodiment will be explained with reference to FIG. 1. FIG. 1 is a schematic longitudinal cross sectional view illustrating a configuration of the plasma processing apparatus in accordance with the first illustrative embodiment.

In the first illustrative embodiment, by way of example, the plasma processing apparatus 10 is configured as an etching apparatus configured to perform an etching process as a plasma process on a semiconductor wafer W (hereinafter, referred to as a "wafer"). The plasma processing apparatus 10 includes a processing chamber 100 for performing therein the plasma process on the wafer W. The inside of the processing chamber 100 is airtightly sealed. The processing chamber 100 has a cylindrical shape made of, but not limited to, a metal such as aluminum, and the processing chamber 100 is electrically grounded.

A susceptor 105 for mounting thereon the wafer W is provided at the bottom portion of the processing chamber 100. The susceptor 105 is made of a metal such as aluminum. The susceptor 105 is supported on a supporting member 115 via an insulator 110. Further, the susceptor 105 is provided at a bottom portion of the processing chamber 100. With this configuration, the susceptor 105 is in an electrically floating state. By way of example, the susceptor 105 and the supporting member 115 may be made of, but not limited to, aluminum having an alumite-treated (anodically oxidized) surface.

The susceptor 105 is connected with a high frequency power supply 125 for bias via a matching device 120. The high frequency power supply 125 supplies a high frequency power for bias to the susceptor 105, whereby ions in plasma are attracted toward the wafer W. Further, although not shown, the susceptor 105 may have an electrostatic chuck for electrostatically attracting and holding the wafer W, a temperature control device, a gas path for supplying a heat transfer gas on a rear surface of the wafer W, elevating pins moved up and down to transfer the wafer, and so forth.

An exhaust port 130 is formed at a bottom portion of the processing chamber 100, and an exhaust device 135 including a non-illustrated vacuum pump is connected to the exhaust port 130. If the exhaust device 135 is operated, the inside of the processing chamber 100 is evacuated and depressurized to a required vacuum level. A loading/unloading port 140 is formed in a sidewall of the processing chamber 100, and a gate valve 145 for opening/closing the loading/unloading port 140 is also provided. By opening/closing the gate valve 145, the loading/unloading port 140 through which the wafer W is loaded and unloaded is opened or closed.

A plasma generation antenna 200 (hereinafter, simply referred to as an "antenna 200") capable of supplying an electromagnetic wave (here, a microwave) is provided above the susceptor 105. The antenna 200 is positioned at an opening of a cover body 150. With this configuration, a plasma space U is formed between the susceptor 105 and the antenna 200. Further, a microwave transmission device 400 for transmitting microwave, which serves as an electromagnetic wave transmission device, is connected to an upper portion of the antenna 200 and configured to transmit a microwave outputted from a microwave output unit 300 to the antenna 200.

A control device 500 for controlling, e.g., a DC voltage applied to the antenna 200 as will be described later. The control device 500 includes a controller 505 and a storage unit 510. The controller 505 is configured to control the DC voltage applied to the antenna 200 for each process according to a recipe stored in the storage device 510. Further, an instruction to the control device 500 is executed by an exclusive control device or a CPU (not shown) for executing a program. The recipe including processing condition data is previously stored in a ROM or a nonvolatile memory (both are not shown). Furthermore, the CPU reads out the conditions of the recipe from the memory and executes them.

Figure 2:
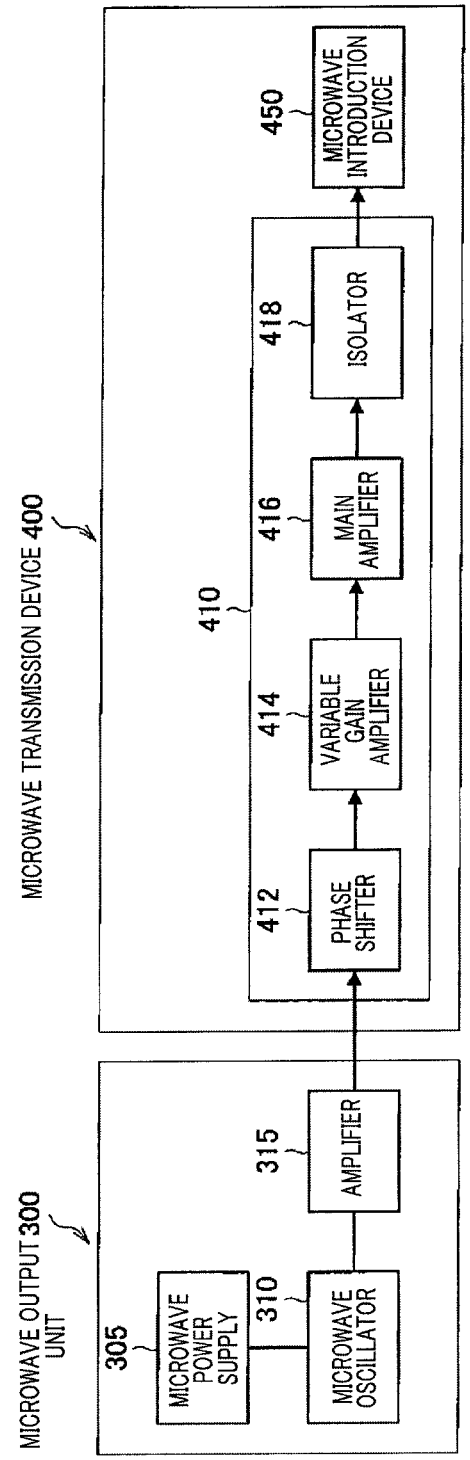
FIG. 2 is a diagram showing devices of a microwave output side in accordance with the first illustrative embodiment.

Referring to FIG. 2, configurations of the microwave output section 300 and the microwave transmission device 400 will be described. The left of FIG. 2 illustrates an internal configuration of the microwave output section 300, and the right of FIG. 2 shows an internal configuration of the microwave transmission device 400.

The microwave output section 300 includes a microwave power supply 305, a microwave oscillator 310 and an amplifier 315. The microwave power supply 305 outputs a microwave having a frequency of, e.g., about 2.45 GHz, about 8.35 GHz, about 5.8 GHz or about 1.98 GHz. The microwave power supply 305 is an example of an electromagnetic wave source and outputs an electromagnetic wave of a microwave band. The electromagnetic wave source is not limited thereto, and may be a power source that outputs an electromagnetic wave ranging from a RF band of, e.g., about 100 MHz to a microwave band of, e.g., about 3 GHz. The microwave oscillator 310 performs PLL oscillation for microwave of a certain frequency, e.g., about 2.45 GHz. The amplifier 315 amplifies the oscillated microwave.

The microwave transmission device 400 includes an antenna module 410 and a microwave introduction device 450. The antenna module 410 includes a phase shifter 412, a variable gain amplifier 414, a main amplifier 416 and an isolator 418. The microwave transmission device 400 transmits the microwave outputted from the microwave output section 300 to the microwave introduction device 450.

The phase shifter 412 is configured to change a phase of microwave by means of a slug tuner, and by controlling the phase of the microwave, radiation property of the microwave can be changed. In this way, directivity of the microwave can be controlled, so that plasma distribution can be varied. Meanwhile, if such modulation of the radiation property is not necessary, the phase shifter 412 may be omitted.

The variable gain amplifier 414 adjusts a power level of microwave inputted to the main amplifier 416 and adjusts plasma intensity. The main amplifier 416 is configured as a solid state amplifier. The solid state amplifier may include, though not shown, an input matching circuit, a semiconductor amplifying device, an output matching circuit and a high-Q resonance circuit.

The isolator 418 isolates a reflection wave of the microwave returned back to the main amplifier 416 after reflected from the antenna 200. The isolator 418 includes a circulator and a dummy load (coaxial terminator). The circulator introduces the microwave reflected by the antenna 200 to the dummy load, and the dummy load converts the reflection wave of the microwave introduced by the circulator to heat.

[Configuration of Plasma Generation Antenna]

Figure 3:
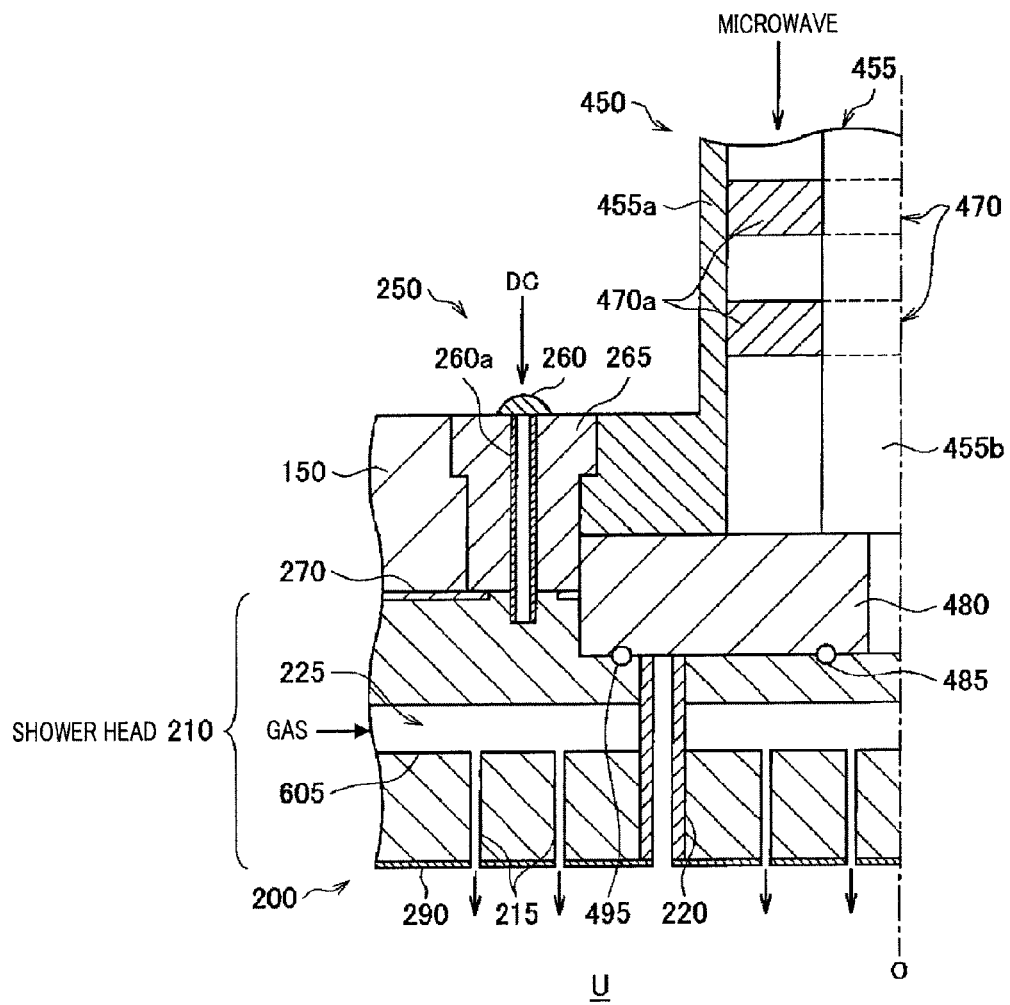
FIG. 3 is an enlarged view of a plasma generation antenna in accordance with the first illustrative embodiment.

Now, configurations of the microwave introduction device 450 and the antenna 200 for plasma generation will be explained with reference to FIG. 3. FIG. 3 shows an enlarged (left-half) view of the microwave introduction device 450 and the antenna 200

The microwave introduction device 450 includes a coaxial tube 455 and a wavelength shortening plate 480. The coaxial tube 455 has a coaxial waveguide formed with a cylindrical outer conductor 455a and a rod-shaped inner conductor 455b provided in the central of the outer conductor 455a. A lower end of the coaxial tube 455 is connected to the antenna 200 via the wavelength shortening plate 480. In the coaxial tube 455, the inner conductor 455b is configured as a power supply side, whereas the outer conductor 455a is configured as a ground side. A tuner 470 is provided in the coaxial tube 455. The tuner 470 is configured as a slug tuner having two slugs 470a. Each of the slugs 470a is formed as a plate body of a dielectric member and is provided in a circular ring shape between the inner conductor 455b and the outer conductor 455a of the coaxial tube 455. In response to an instruction from the controller 505, the tuner 470 adjusts impedance by moving the slugs 470a up and down by a non-illustrated actuator. By way of example, the controller 505 adjusts the impedance so as to obtain characteristic impedance of, e.g., about 50Ω at an end portion of the coaxial tube 455.

The wavelength shortening plate 480 is positioned in contact with a bottom surface of the coaxial tube 455. The wavelength shortening plate 480 is made of a dielectric member having a circular plate shape. The wavelength shortening plate 480 transmits and guides microwave transmitted through the coaxial tube 455 to the antenna 200.

The antenna 200 includes a shower head (gas shower head) 210 and a device (hereinafter, referred to as a "DC application device" 250) configured to apply a DC voltage to the shower head 210. The shower head 210 is provided in contact with a bottom surface of the wavelength shortening plate 480. The shower head 210 has a circular plate shape having a larger diameter than that of the wavelength shortening plate 480. Further, the shower head 210 is made of a conductor having high electrical conductivity, such as aluminum or copper. A bottom surface of the shower head 210 is exposed to the plasma space U, and a surface wave is propagated in the exposed bottom surface. In the present illustrative embodiment, a metal surface of the shower head 210 is exposed to the plasma space U. Hereinafter, the surface wave propagated on the exposed bottom surface will be referred to as a "metal surface wave".

The shower head 210 has a multiple number of gas holes 215 and a plurality of slots 220 through which microwave passes. The slots 220 are provided at positions separated from the gas holes 215. A gas path 225 is formed in the shower head 210 through a sidewall thereof in a diametric direction of the shower head 210. A gas supplied from a gas supply source 600 (see FIG. 1) is introduced into the gas path 225 from a gas supply line 605 and then is introduced into the multiple number of gas holes 215 from the gas path 225. The gas is introduced into the processing chamber from the gas holes 215. The surface of the shower head 210 exposed to the plasma space U is covered with a film 290 of, e.g., alumina ($Al_2O_3$) or yttria ($Y_2O_3$) so as to prevent a conductive surface from being exposed to the plasma space U. The film 290 is provided with openings communicating with the plurality of slots 220 and the multiple number of gas holes 215.

A non-illustrated cooling path is formed in the shower head 210 so as to cool the shower head 210. Since the shower head 210 is made of a conductor having high electrical conductivity, heat from the slots 220 serving as a transmission path of the microwave can be efficiently radiated toward a main body of the processing chamber.

The plurality of slots 220 are formed at positions isolated from the gas path 225 and the gas holes 215 serving as supply paths of the gas. The slots 220 are formed through the shower head 210 in a perpendicular direction to the diametric direction of the shower head 210. One end of each slot 220 is in contact with the wavelength shortening plate 480 while the other end thereof is opened to the plasma space U. The microwave is radiated to the plasma space U through the plurality of slots 220 after transmitted through the coaxial tube 455 and the wavelength shortening plate 480.

Figure 4:
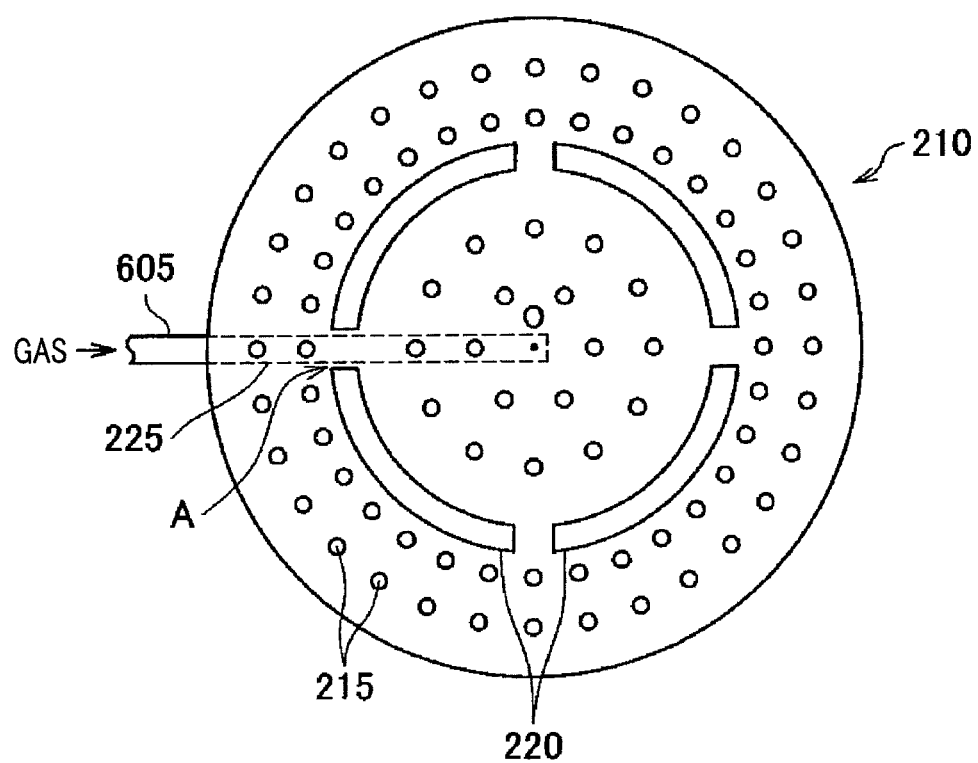
FIG. 4 is a bottom view of a shower head in accordance with the first illustrative embodiment.

FIG. 4 is a diagram showing the surface (bottom surface) of the shower head 210 exposed to the plasma space U. The multiple number of gas holes 215 are substantially regularly arranged. The gas holes 215 are provided at inner peripheral and outer peripheral portions of the substantially ring-shaped slot 220. The slots 220 do not have a complete ring shape but have four partitioned fan shapes. The gas path 225 is formed at a partitioned portion A between the slots 220 so as not to communicate with the slots 220. With this configuration, the gas is introduced into the gas holes 215 arranged at inner peripheral positions of the slots 220. Accordingly, at least one partitioned portion needs to be provided between the slots 220. In the present illustrative embodiment, although the four slots 220 are provided, the number of the slots 220 may not be limited thereto as long as at least one partitioned portion is provided therebetween.

The plurality of slots 220 are symmetrically arranged with respect to a central axis (central axis O of FIG. 3) of the antenna 200. As a result, the microwave can be more uniformly radiated through the slots 220.

The gas holes 215 are formed as narrow holes so as to prevent the microwave radiated to the plasma space U from being introduced into the inside of the gas holes 215. Further, the slots 220 and the gas holes 215 are isolated separated within the shower head 210. Accordingly, an abnormal electric discharge can be prevented in the gas path 225 and the gas holes 215.

Referring back to FIG. 3, an O-ring 485 and an O-ring 495 are provided on a contact surface between the wavelength shortening plate 480 and the shower head 210. As a result, the insides of the shower head 210 and the processing chamber 100 is airtightly sealed against the microwave transmission device 400 provided at the atmosphere side. With this configuration, the insides of the plasma space U, the slots 220, the gas path 225 and the gas holes 215 can be set in a vacuum state.

As in the present illustrative embodiment, when the shower head 210 is made of a conductor, the DC voltage can be applied to the shower head 210. Specifically, in response to an instruction from the controller 505, a DC voltage outputted from the DC power supply 255 is supplied to the DC application device 250. The DC application device 250 includes a DC electrode 260, an insulating member 265 and an insulating sheet 270. The DC electrode 260 has a cylindrical conductor 260a and is connected with the shower head 210 via the cylindrical conductor 260a. With this configuration, the DC voltage can be applied to the shower head 210. The DC electrode 260 is fastened to the shower head 210 by a screw via a non-illustrated insulating socket provided at a lower end of the cylindrical conductor 260a.

The DC electrode 260 is positioned in a vicinity of the outer conductor 455a of the coaxial tube 455 and the cover body 150. Accordingly, in order to insulate the DC electrode 260 from the coaxial tube 455 and the cover body 150 in a DC way, the DC electrode 260 is covered with the insulating member 265, Further, in order to insulate the shower head 210 from the coaxial tube 455 and the cover body 150 in a DC way, an insulating sheet 270 is positioned between the shower head 210 and the coaxial tube 455 and between the shower head 210 and the cover body 150. In this way, by insulating the processing chamber 100 in a DC way, the DC voltage can be applied only to the shower head 210, and the number of component to which the DC voltage is applied can be minimized. Moreover, when the shower head 210 is made of an insulator, it may not be possible to apply a DC voltage to the shower head 210. In such a case, however, the same effect may be achieved if a RF voltage is applied thereto.

As discussed above, in accordance with the plasma processing apparatus 10 of the present illustrative embodiment, the microwave introduced through the coaxial tube 455 is radiated to the plasma space U through the plurality of slots 220 after transmitted through the wavelength shortening plate 480 and the shower head 210. At this time, a standing wave (metal surface wave) having a wavelength characterized by a dispersion relation in which a a plasma sheath is a boundary condition is generated on the surface of the shower head 210. The standing wave is absorbed by surface wave plasma. The gas supplied from the gas supply source 600 is also introduced into the plasma space U through the shower head 210. The introduced gas is excited by the surface wave plasma. As a result, plasma having low electron temperature and high density is generated in the plasma space U within the processing chamber 100. The generated plasma is used for an etching process on a wafer W. Since the plasma has low electron temperature, the wafer W may be hardly damaged. Further, since the plasma has high density, high-speed microprocessing can be performed on the wafer W. Furthermore, by forming the shower head 210 as a conductor, a process such as reactive plasma etching can be performed.

With regard to a general surface wave plasma source, a dielectric member is provided under an antenna slot. If a shower head structure is formed of the dielectric member, an abnormal discharge is highly likely to occur inside in the shower head structure because an electromagnetic wave passes through the dielectric member. Thus, it has been very difficult to employ the shower head structure in the general surface wave plasma source. By way of example, as for argon plasma, when there is an empty space of, e.g., about 10 mm in a shower head space, there is a high likelihood that an abnormal electric discharge occurs at a pressure of, e.g., about 1 Torr if a voltage of, e.g., about 120 volts is generated within the shower head space along the distance of the empty space.

In contrast, in the plasma processing apparatus 10 in accordance with the present illustrative embodiment, since the shower head 210 is made of a conductor such as metal, the electromagnetic wave does not reach the inside of the shower head 210. Further, an electric field within the shower head 210 hardly exists. Thus, an abnormal electric discharge does not occur. The electromagnetic wave and the gas are isolated within the shower head 210 and come into contact with each other for the first time after introduced in the processing chamber 100. Thus, by using the plasma processing apparatus 10 in accordance with the present illustrative embodiment, surface wave plasma can be generated without the abnormal electric discharge while the gas is uniformly discharged through the shower head 210.

Moreover, in accordance with the plasma processing apparatus 10 of the present illustrative embodiment, it is possible to supply the microwave to the shower head 210 while applying the DC voltage thereto. Accordingly, the plasma processing apparatus 10 can be applied to a wide variety of processes. By way of example, once the microwave is supplied to the shower head 210, a surface wave propagates on the surface of the shower head 210. At this time, a sheath region is formed on the surface of the shower head 210, and the surface wave propagates on the sheath. Here, the DC voltage controls a thickness of the sheath. For example, the sheath can be controlled to be thick by applying the DC voltage to the shower head 210. As a result, a propagation distance of the surface wave propagating on the surface of the shower head 210 can be increased. In this way, by adjusting a plasma sheath voltage by the control of the DC voltage, the propagation distance of the surface wave can be controlled, and electron density distribution and radical density distribution of plasma can be optimized.

[Modification Examples of Slot]

Modification examples of the slots formed at the antenna 200 will be described with reference to FIG. 5. In an upper portion, a middle portion, and a lower portion of FIG. 5, slots 220 having different shapes are illustrated. In the upper portion of FIG. 5, a slot segmented into six slots 220 is illustrated. The slots 220 have the same shape. Further, each slot is thick in its central portion and thin in its two opposite end portions. The slots 220 are arranged such that end portions of every two adjacent slots 220 face each other.

Figure 5:
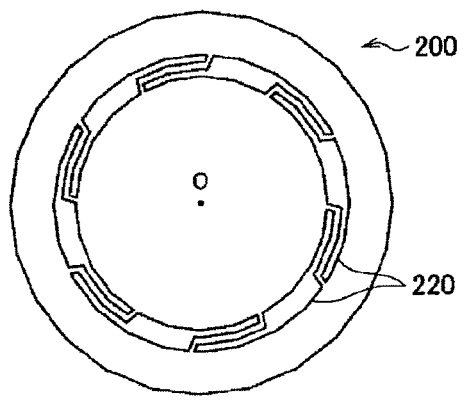
FIG. 5 illustrates modification examples of a slot shape.
Figure 5:
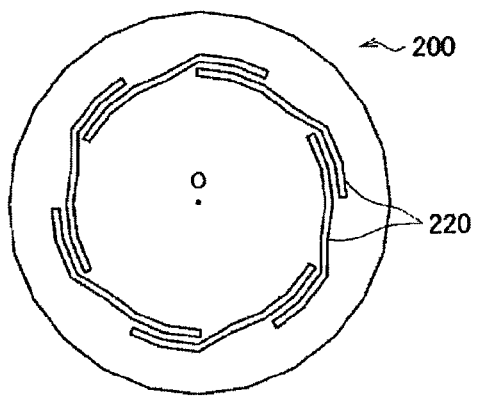
Figure 5:
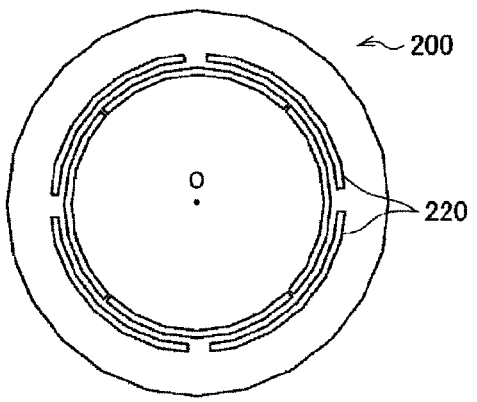

A slot in the middle portion of FIG. 5 is also segmented into six slots 220. Thicknesses of a central portion and two opposite end portions of each slot 220 are same. The slots 220 have the same shape, and each slot 220 is slightly curved and slanted to a certain direction. The slots 220 are arranged such that end portions of every two adjacent slots 220 face each other.

A slot in the lower portion of FIG. 5 has a double-slot structure having four outer slots 220 and four inner slots 220. The slots 220 have the same shape, and each slot 220 has a circular arc shape having a uniform thickness. Partitioned portions between the outer slots 220 are positioned to correspond to the centers of the inner slots 220, respectively. The partitioned portions between the inner slots 220 are positioned to correspond to the centers of the outer slots 220.

In all of the modification examples, the slots 220 are symmetrical to each other with respect to the central axis of the antenna 200. With this configuration, a microwave can be uniformly radiated into the processing chamber 100. Further, the slots 220 have at least one partitioned portion. With this configuration, a gas can be supplied from gas holes 215 (not illustrated) arranged at inner and outer positions of the slots 220.

Second Illustrative Embodiment

Configuration of Plasma Generation Antenna

Figure 6:
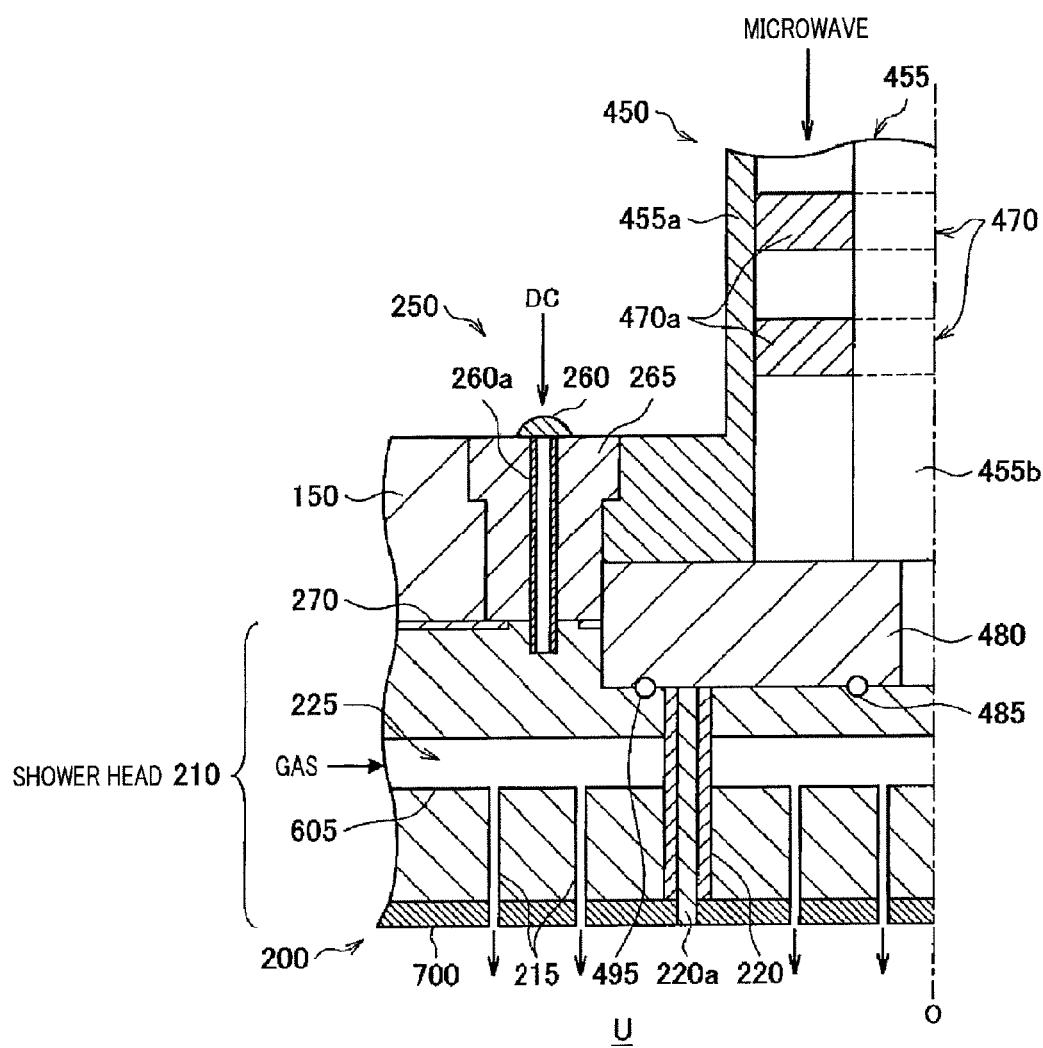
FIG. 6 is an enlarge view of a plasma generation antenna in accordance with a second illustrative embodiment.

Now, a configuration of a plasma generation antenna in accordance with a second illustrative embodiment will be described with reference to FIG. 6. FIG. 6 shows an enlarged (left-half) view of the antenna 200 for plasma generation in accordance with the second illustrative embodiment. The antenna 200 can be applied to the plasma processing apparatus 10 of FIG. 1 in lieu of the antenna of the first illustrative embodiment.

A plurality of slots 220 in accordance with the second illustrative embodiment are filled with a dielectric member 220a. The dielectric member 220a may be, but not limited to, quartz. With this configuration, it is possible to prevent plasma from being introduced into the slots 220.

In accordance with the second illustrative embodiment, a shower head 210 is made of, for example, aluminum. A silicon ceiling plate 700 is fixed on a surface of the shower head 210 exposed to a plasma space. With this configuration, the ceiling plate 700 damaged by plasma can be replaced. As a result, a lifetime of the shower head 210 can be extended. The ceiling plate 700 is provided with openings, which communicate with the plurality of slots 220 and a multiple number of gas holes 215. Like the slots 220, the openings that communicate with the slots 220 are also filled with the dielectric member 220a.

Modification Example

Figure 7:
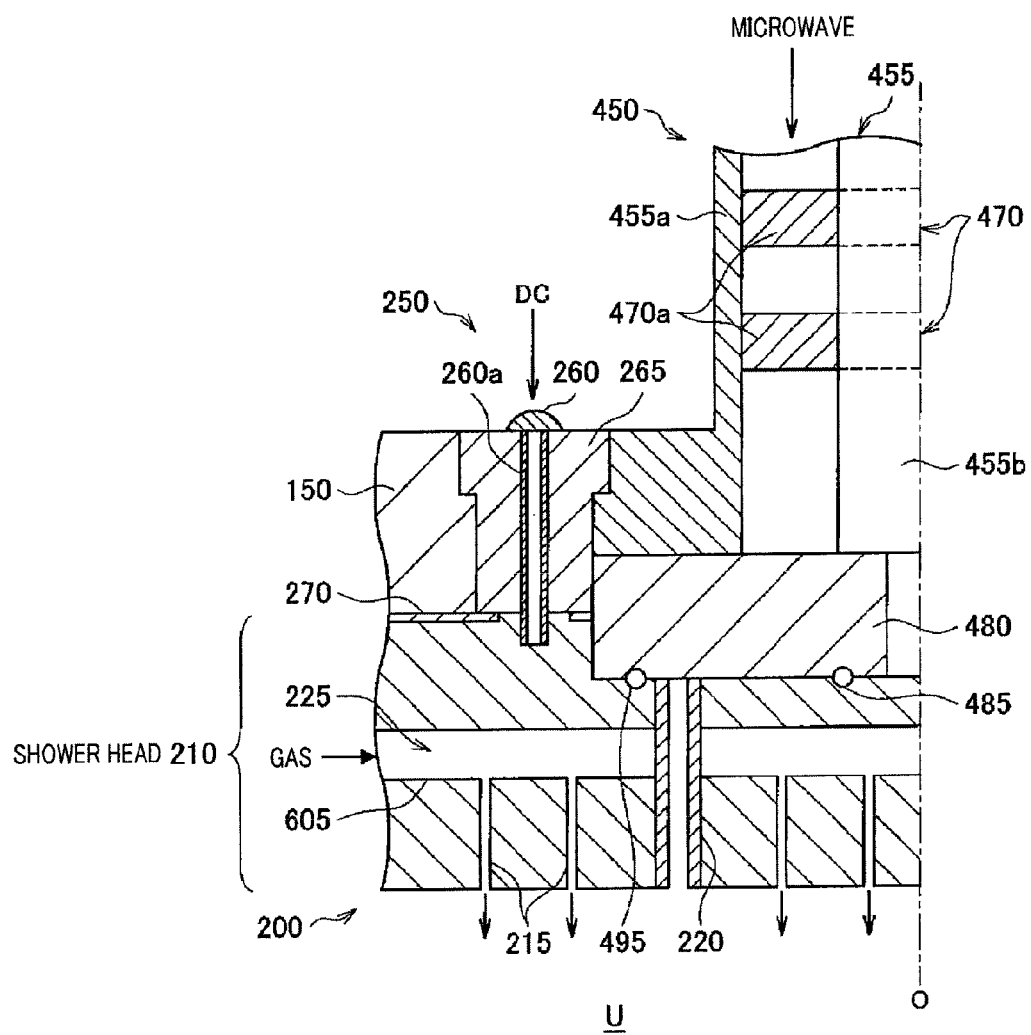
FIG. 7 is an enlarged view of a plasma generation antenna in accordance with a modification example of the second illustrative embodiment.

A modification example of the second illustrative embodiment in which the shower head 210 is made of silicon will be described. In this case, a silicon surface of the shower head 210 is exposed, as illustrated in FIG. 7, without being thermally sprayed or covered with a ceiling plate 700.

In the second illustrative embodiment and the modification example thereof, it is also possible to supply microwave to the shower head 210 while applying a DC voltage thereto. With this configuration, the plasma processing apparatus 10 can be applied to various processes. For example, once the microwave is supplied to the shower head 210, a surface wave propagates on the surface of the shower head 210. At this time, a sheath region is formed on the surface of the shower head 210, and the surface wave propagates on the sheath. The DC voltage controls a thickness of the sheath. For example, the sheath can be controlled to be thick by applying the DC voltage to the shower head 210. As a result, a propagation distance of the surface wave propagating on the surface of the shower head 210 can be increased. In this way, by adjusting a plasma sheath voltage by the control of the DC voltage, the propagation distance of the surface wave can be controlled, and electron temperature of plasma can be optimized. Furthermore, in the modification example, if the DC voltage is applied to the shower head 210, silicon is come off from the shower head 210. As a result, it is possible to improve etching selectivity.

Upon the generation of plasma, depending on a type of a gas, a pressure, and a magnitude of a high frequency power, the plasma may be excessively concentrated in a vicinity of the slots 220. As a result, the plasma uniformity may be destroyed. In the plasma processing apparatus 10 in accordance with the second illustrative embodiment, however, the insides of the slots 220 are filled with the dielectric members 220a, as described above. Accordingly, it is possible to prevent the plasma from being introduced into the slots 220. As a result, the plasma uniformity can be improved. Further, the dielectric members 220a filled in the slots 220 may shorten an effective wavelength of the microwave passing through the slots. Accordingly, the thickness of the shower head 210 can be reduced.

Third Illustrative Embodiment

Configuration of Plasma Generation Antenna

Figure 8:
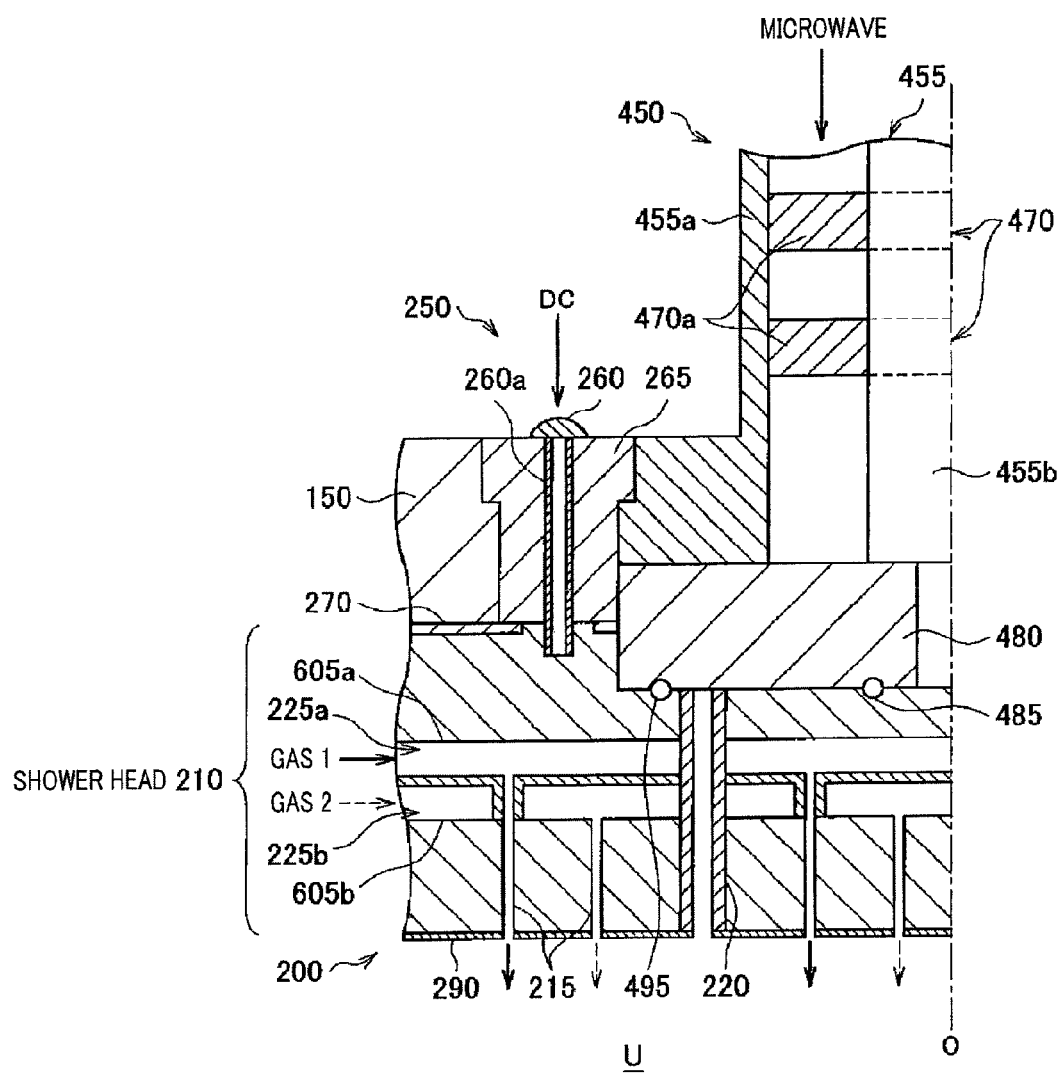
FIG. 8 is an enlarged view of a plasma generation antenna in accordance with a third illustrative embodiment.

Now, a configuration of a plasma generation antenna in accordance with a third illustrative embodiment will be described with reference to FIG. 8. FIG. 8 is an enlarged (left-half) view of the plasma generation antenna in accordance with the third illustrative embodiment. The antenna 200 for plasma generation in accordance with the third illustrative embodiment can be applied to the plasma processing apparatus 10 of FIG. 1 in lieu of the antenna in accordance with the first illustrative embodiment.

In accordance with the third illustrative embodiment, a gas path of a shower head 210 is divided into a first gas path 225a and a second gas path 225b. The first gas path 225a and the second gas path 225b are completely isolated from each other. The first gas path 225a is connected to a gas supply line 605a. The second gas path 225b is connected to a gas supply line 605b. A required gas 1 supplied from the gas supply source 600 (see FIG. 1) through the gas supply line 605a is introduced into a multiple number of gas holes 215 through the first gas path 225a. The required gas 1 is introduced into the processing chamber from the gas holes 215. Another required gas 2 supplied from the gas supply source 600 (see FIG. 1) through the gas supply line 605b is introduced into a multiple number of other gas holes 215 through the second gas path 225b. The required gas 2 is introduced from the other gas holes 215 into the processing chamber. With this configuration, different types of gases can be alternatively introduced from adjacent gas holes.

As described above, in accordance with the plasma processing apparatus 10 of the third illustrative embodiment, two independent shower head spaces (matrix shower) are formed in the shower head 210. With this configuration, flows of two types of gases (dual system) can be controlled independently. The gases are supplied from the respective shower head spaces into the processing chamber 100 and mixed in a space within the processing chamber. With this configuration, at least two types of gases can be reacted (post mix). Further, a position for introducing a gas can be selected depending on the type of the gas. As a result, required plasma can be generated. Furthermore, the gas path is not limited to the dual system and may have a triple or more system capable of independently supplying at least three types of gases without mixing them.

Fourth Illustrative Embodiment

Configuration of Plasma Generation Antenna

Figure 9:
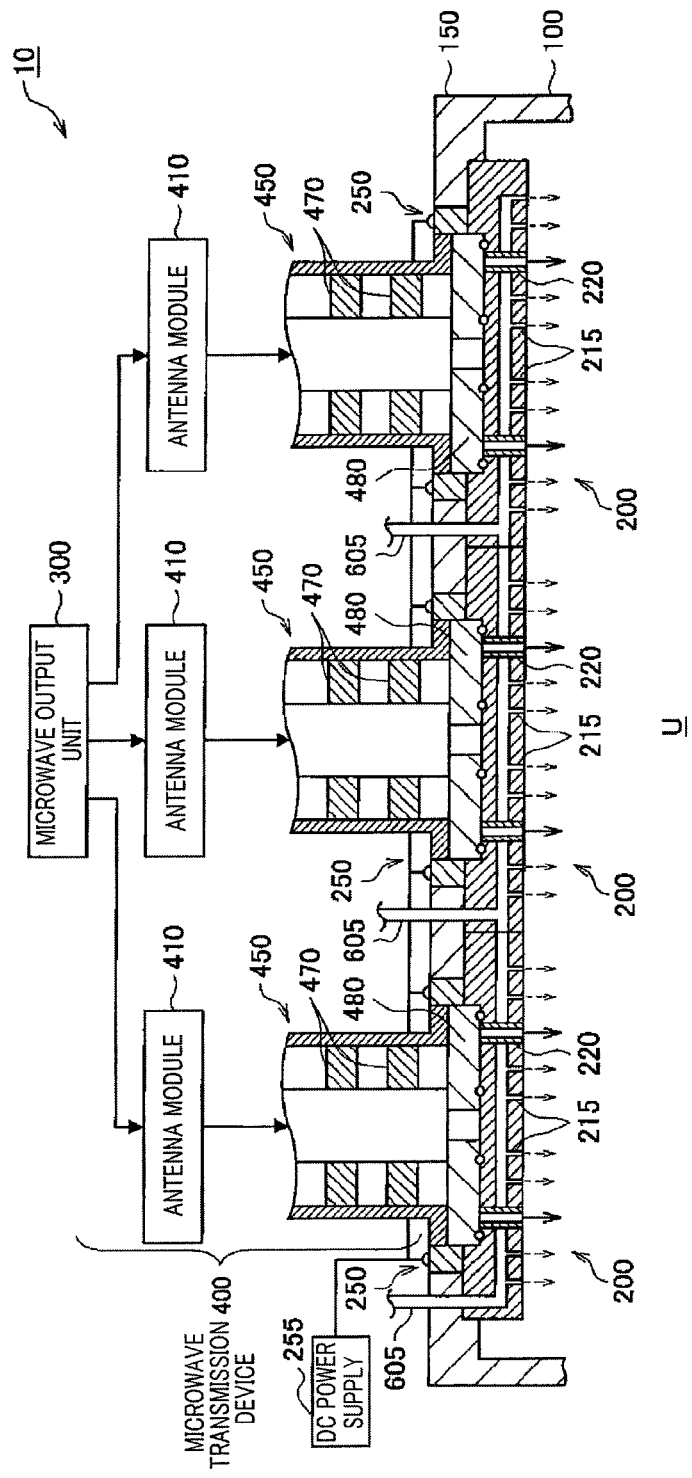
FIG. 9 is a diagram showing a plasma generation antenna in accordance with a fourth illustrative embodiment.
Figure 10:
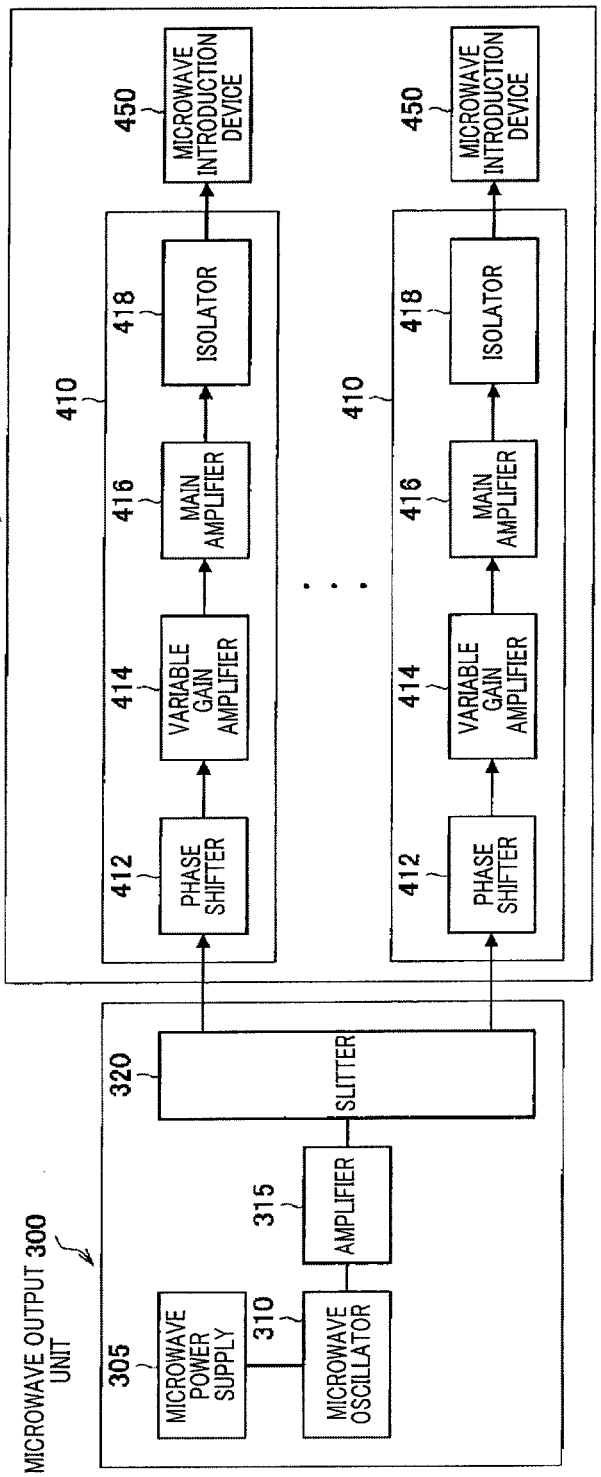
FIG. 10 is a diagram showing devices of a microwave output side in accordance with the fourth illustrative embodiment.

Now, a configuration of a plasma generation antenna in accordance with a fourth illustrative embodiment will be described with reference to FIGS. 9 and 10. FIG. 9 illustrates an antenna portion of a plasma processing apparatus in accordance with the fourth illustrative example. In FIG. 9, the parts below the antenna 200 are not shown. The plasma processing apparatus 10 in accordance with the fourth illustrative embodiment has the same configuration as that of the plasma processing apparatus in accordance with the first illustrative embodiment. FIG. 10 illustrates configurations of the microwave output section 300 and the microwave transmission device 400.

In the plasma processing apparatus 10 of the fourth illustrative embodiment, three antennas 200 are provided on the cover body 150. Since the basic configuration of each antenna 200 is the same as described in the first illustrative embodiment, description thereof is omitted.

In the plasma processing apparatus 10 in accordance with the fourth illustrative embodiment, microwave is outputted from the microwave power supply 305 in the microwave output section 300 of FIG. 10. Then, the microwave passes through the microwave oscillator 310 and the amplifier 315, and then, is split by a splitter 320.

Specifically, the microwave oscillator 310 performs PLL oscillation for the microwave of a certain frequency, e.g., about 2.45 GHz. The amplifier 315 amplifies the oscillated microwave. The splitter 320 splits the amplified microwave in a plural number. Specifically, the splitter 320 splits the microwave amplified by the amplifier 315 while matching impedance between an input side and an output side in order to minimize a loss of the microwave. The split microwaves are transmitted to respective antenna modules 410.

In this fourth illustrative embodiment, the microwave transmission device 400 has three antenna modules 410 for transmitting the microwaves split by the splitter 320. Each of the antenna modules 410 radiates the microwaves into the processing chamber 100 through coaxial tubes 455 respectively connected to the antenna modules 410. The microwaves are mixed within the processing chamber 100. Accordingly, it is desirable that an isolator 418 of each antenna module 410 is small and may be provided adjacent to a main amplifier 416.

The phase shifter 412 of each antenna module 410 is configured to change the phase of the microwave by means of the slug tuner. By controlling the phase, a radiation property of the microwave can be modulated. For example, by adjusting the phase of the microwave for each of the antenna modules 410, directivity of the microwave is controlled. As a result, plasma distribution can be varied. Further, by adjusting phases of the microwaves of the neighboring antenna modules 410 to be deviated from each other by, e.g., about 90°, a circular polarized wave can be obtained. Furthermore, when such modulation of the radiation property is not necessary, the phase shifter 412 may be omitted.

A variable gain amplifier 414 adjusts a power level of the microwave inputted to the main amplifier 416. Further, the variable gain amplifier is configured to adjust a difference between the respective antenna modules 410 and also adjust plasma intensity. It may be possible to vary the plasma distribution by controlling the variable gain amplifiers 414 of the respective antenna modules 410 independently.

The main amplifier 416 is configured as the solid state amplifier. The solid state amplifier may include, though not shown, the input matching circuit, the semiconductor amplifying device, the output matching circuit and the high-Q resonance circuit The isolator 418 isolates the reflection wave of the microwave reflected from the antenna 200 toward the main amplifier 416. The isolator 418 has the circulator and the dummy load (coaxial terminator). The circulator introduces the microwave reflected from the antenna 200 to the dummy load. The dummy load converts the microwave introduced by the circulator into heat. The microwave outputted from the antenna module 410 is transmitted to the microwave introduction device 450 and introduced to the antenna 200.

Figure 11:
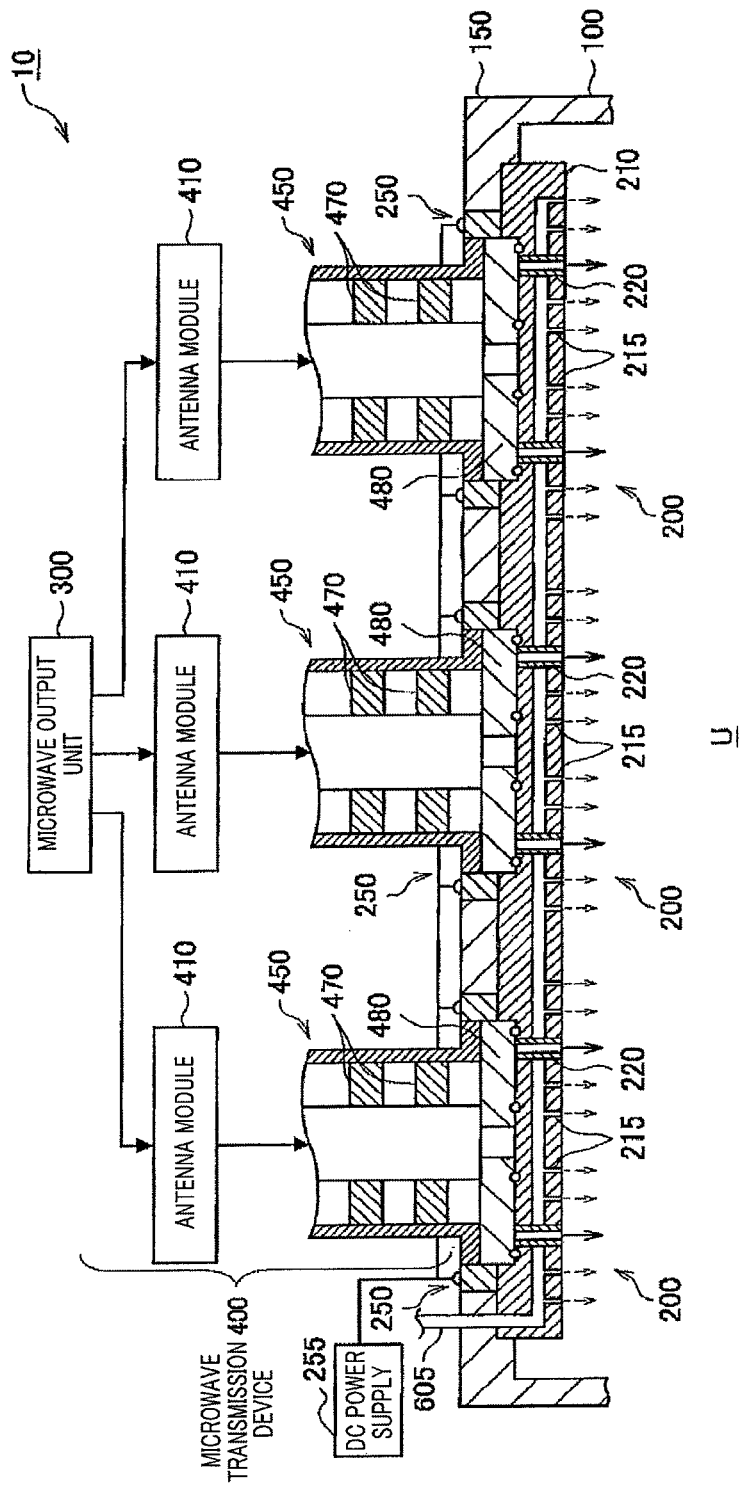
FIG. 11 is a diagram illustrating a modification example of the plasma generation antenna in accordance with the fourth illustrative embodiment.

Further, in the fourth illustrative embodiment, the three antennas 200 are separately provided at the cover body 150 and the gas supply lines 605 are provided for the respective antennas 200. That is, the shower heads 210 are individually provided for the respective antennas 200. However, it may be easier to provide a single shower head 210 for the multiple antennas 200 in the aspect of manufacturing efficiency. Accordingly, in accordance with a modification example of the fourth illustrative embodiment, as illustrated in FIG. 11, for example, a single shower head 210 is commonly provided for three antennas 200. In such a configuration, a single gas supply line 605 is provided for the single shower head 210. In FIG. 11, the basic configuration of each antenna 200 is the same as that shown in FIG. 9 excepting that the multiple antennas 200 share the single shower head 210 and the single gas supply line 605.

Figure 12:
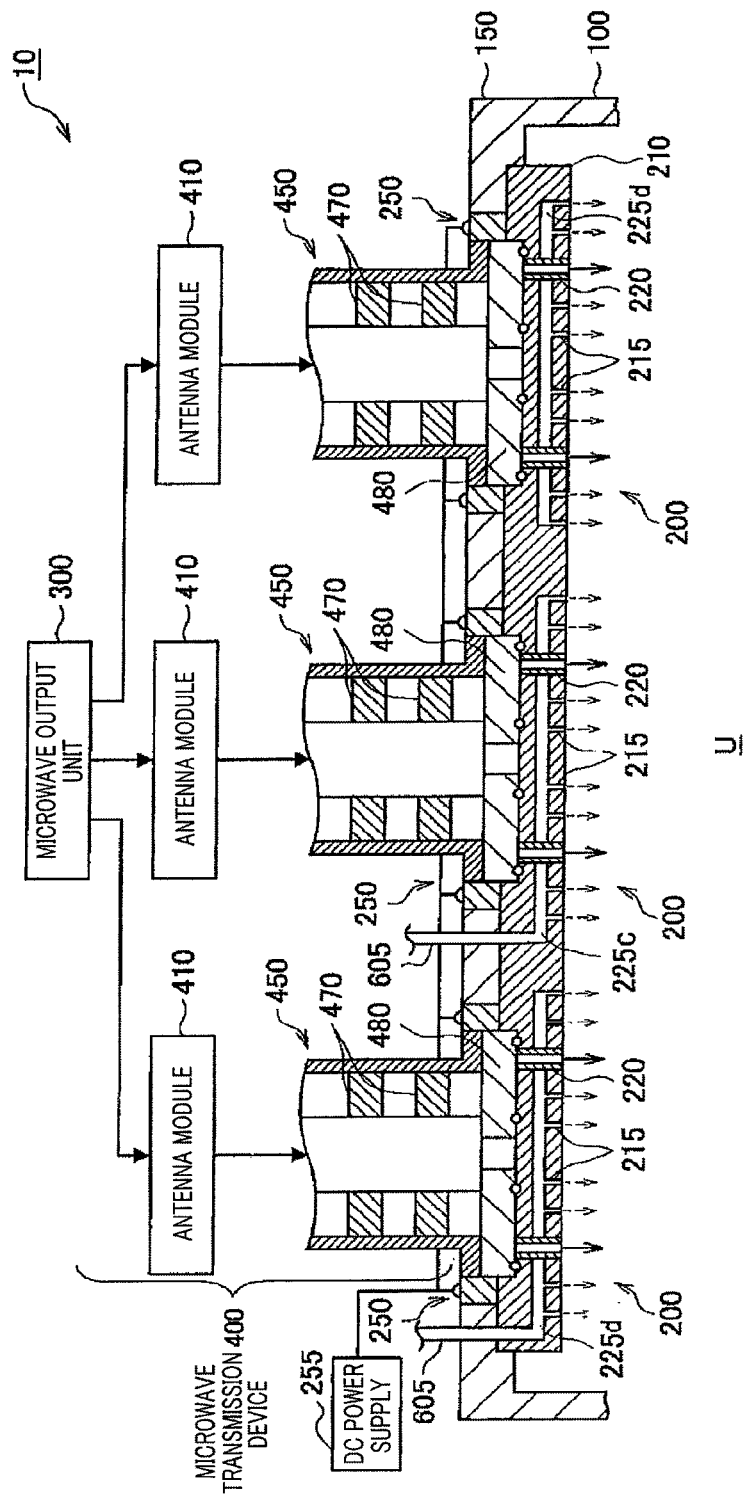
FIG. 12 is a diagram illustrating a modification example of the plasma generation antenna in accordance with the fourth illustrative embodiment.

Further, when providing the single shower head 210 for the multiple antennas 200, circular ring-shaped gas paths 225 may be concentrically formed with respect to the central axis of the cover body 150. In such a configuration, the respective gas paths 225 are isolated from each other. To be specific, as illustrated in FIG. 12, for example, dual gas paths 225c and 225d are formed within the shower head 210. The gas paths 225c and 225d are provided with respective gas supply lines 605. With this configuration, flow rates and kinds of gases introduced into the plasma space U can be set differently at a central region and a peripheral region of the shower head 210.

[Operation of Plasma Generation Antenna]

Now, an operation of the plasma processing apparatus 10 in accordance with the first to fourth illustrative embodiments will be described with reference to FIG. 1. First, a wafer W is loaded into the processing chamber 100 and mounted on the susceptor 105. A plasma gas such as an Ar gas is supplied from the gas supply source 600 through the gas supply line 605 and is introduced into the processing chamber 100 through the antenna 200. Microwave is outputted from the microwave output section 300 and introduced into the processing chamber 100 through the microwave transmission device 400, the wavelength shortening plate 480, and the slots 220. The plasma gas is excited by electric field energy of the microwave. As a result, plasma is generated.

Subsequently, an etching gas such as a $Cl_2$ gas is supplied from the gas supply source 600 and is introduced from the antenna 200 into the processing chamber 100 through a plurality of branch lines of the gas supply line 605. The etching gas is also excited into plasma. By the plasma of the processing gas thus formed, a process such as an etching process is performed on the wafer W. Since the plasma has low electron temperature, the wafer W is hardly likely to be damaged. Further, since the plasma has high density, high-speed microprocessing can be performed on the wafer W.

Especially, in the plasma processing apparatus 10 in accordance with the fourth illustrative embodiment, the microwave oscillated by the microwave oscillator 310 is amplified by the amplifier 315, and then, split into a multiple number of microwaves by the splitter 320. The split microwaves are introduced into the multiple number of the antenna modules 410. In the antenna modules 410, the split microwaves are individually amplified by the main amplifiers 416 serving as solid state amplifiers, and then, are transmitted to the respective microwave introduction devices 450. In each of the microwave introduction devices 450, the microwave is transmitted to the wavelength shortening plate 480 through the coaxial tube 455. The microwave passes through the wavelength shortening plate 480 and is radiated into the processing chamber from the slots 220 of each shower head 210.

In accordance with the illustrative embodiments, it is possible to provide the plasma processing apparatus 10 and the plasma generation antenna 200 capable of supplying the gas and the electromagnetic wave separately.

In the above, the illustrative embodiments have been described in detail with reference to the accompanying drawings. However, the illustrative embodiments do not limit the present disclosure. It would be understood by those skilled in the art that various changes and modifications may be made without changing technical conception and essential features of the illustrative embodiments.

For example, in the above-described illustrative embodiments, an etching process has been described as a plasma process performed in the plasma processing apparatus. However, the illustrative embodiments are not limited thereto. For example, any of various plasma processes such as film forming process and ashing process may be performed in the plasma processing apparatus of the illustrative embodiments.

The use of the plasma generation antenna in accordance with the illustrative embodiments is not limited to the microwave plasma processing apparatus illustrated in the above-described embodiments. The plasma generation antenna in accordance with the illustrative embodiments may be applied to any of various plasma processing apparatuses such as an inductively coupled plasma (ICP) processing apparatus and a capacitively coupled plasma (CCP) processing apparatus. The plasma processing apparatus in accordance with the illustrative embodiments may be applied to various processes such as a process using surface wave plasma, a process using ICP plasma and a process using CCP plasma.

In the illustrative embodiments, one or three antennas for plasma generation are provided in the plasma processing apparatus. However, the number of the antennas provided in the plasma processing apparatus is not limited thereto. Further, two or four or more antennas may be provided in the plasma processing apparatus of the illustrative embodiments. However, when sputtering the wafer W with ions, it is desirable that the plasma processing apparatus has a multiple number of antennas for plasma generation. When the wafer W reacts with radicals, it is desirable that the plasma processing apparatus has only one plasma generation antenna.

The shape of the processing chamber in the plasma processing apparatus in accordance with the illustrative embodiments is not limited to the cylindrical shape. By way of example, the processing chamber may have a hexagonal or a square shape. Accordingly, the object to be processed in the plasma processing apparatus of the illustrative embodiments is not limited to the disc-shaped semiconductor wafer but may be, for example, a rectangular substrate.

What is claimed is:

1. A plasma processing apparatus comprising:
   a processing chamber in which a plasma process is performed;
   a cover body provided at an upper part of the processing chamber and configured to cover the processing chamber;
   a wavelength shortening plate configured to transmit an electromagnetic wave;
   a coaxial tube provided on the wavelength shortening plate and configured to transmit the electromagnetic wave to the wavelength shortening plate;
   at least one plasma generation antenna having a shower head provided adjacent to the wavelength shortening plate;
   a gas path formed in the shower head through a sidewall thereof in a diametric direction of the shower head; and
   a DC voltage application device configured to apply a DC voltage to the shower head,
   wherein:
      the shower head is made of a conductor, and has a multiple number of gas holes and a plurality of slots through which the electromagnetic wave passes,
      the plurality of slots are provided at positions isolated from the multiple number of gas holes,
      the wavelength shortening plate is provided above the gas path,
      one end of each slot is in contact with the wavelength shortening plate and the other end thereof is opened to a plasma space within the processing chamber, the plurality of slots form substantial ring shape and have at least one partitioned portion on a single circle between the plurality of slots, the gas path having a continuous linear shape and extended to a center of the shower head is formed at the partitioned portion between the plurality of the slots, such that gas is introduced into the multiple number of gas holes from the gas path and introduced to the plasma space through the multiple number of gas holes of the shower head, and the DC voltage application device includes: a DC electrode connected with the shower head via a cylindrical conductor; an insulating member provided between the DC electrode and the coaxial tube; and an insulating sheet provided between the showerhead and the cover body.

2. The plasma processing apparatus of claim 1, wherein a surface wave is propagated on a surface of the shower head exposed to a plasma space.

3. The plasma processing apparatus of claim 2, wherein the multiple number of gas holes are provided at inner and outer positions of the plurality of slots in the shower head.

4. The plasma processing apparatus of claim 3, wherein the gas path is configured to supply a gas into the gas holes provided at the inner positions of the plurality of slots.

5. The plasma processing apparatus of claim 2, wherein the at least one plasma generation antenna includes an electromagnetic wave transmission device configured to adjust an electric power of the surface wave.

6. The plasma processing apparatus of claim 1, wherein the plurality of slots are filled with a dielectric member.

7. The plasma processing apparatus of claim 1, wherein the plurality of slots are symmetrically arranged with respect to a central axis of the at least one plasma generation antenna.

* * * * *